United States Patent [19]
Gilberg et al.

[11] Patent Number: 5,083,293
[45] Date of Patent: Jan. 21, 1992

[54] PREVENTION OF ALTERATION OF DATA STORED IN SECURE INTEGRATED CIRCUIT CHIP MEMORY

[75] Inventors: Robert C. Gilberg, San Diego; Paul Moroney, Cardiff-By-The-Sea; William A. Shumate, San Diego, all of Calif.

[73] Assignee: General Instrument Corporation, New York, N.Y.

[21] Appl. No.: 297,137

[22] Filed: Jan. 12, 1989

[51] Int. Cl.$^5$ .................. G11C 7/00; G11C 16/02; G11C 13/00

[52] U.S. Cl. .................. 365/189.01; 365/225.7; 365/228

[58] Field of Search ........... 360/60; 365/225.7, 233.5, 365/189.01, 189.03, 230.06, 228

[56] References Cited

U.S. PATENT DOCUMENTS

| | | | |
|---|---|---|---|
| 4,687,951 | 8/1987 | McElroy | 365/225.7 X |
| 4,744,062 | 5/1988 | Nakamura et al. | 365/228 X |
| 4,796,235 | 1/1989 | Sparks et al. | 365/228 X |
| 4,821,240 | 4/1989 | Nakamura et al. | 365/228 |
| 4,833,650 | 5/1989 | Hirayama et al. | 365/225.7 |

Primary Examiner—Alyssa H. Bowler
Attorney, Agent, or Firm—Edward W. Callan

[57] ABSTRACT

An integrated circuit chip in which alteration of secure data stored in a predetermined location of a memory on the chip may be prevented. In one embodiment, the chip includes a memory having a plurality of memory locations, with a predetermined location being for the storage of unalterable secure data; a memory control logic circuit coupled to the memory by an address bus for causing data to be stored in locations of the memory indicated by address signals provided on the address bus; a fuse element having an initial state and an irreversibly altered state; means coupled to the fuse element for irreversibly altering the state of the fuse element in response to a predetermined control signal; and a decoder coupled to the fuse element, the memory control circuit and the address bus for monitoring the state of the fuse element and said address signals, and for preventing the memory control circuit from causing data to be stored in the predetermined memory location after the state of the fuse element has been altered irreversibly whenever the predetermined memory location is indicated by an address signal on the address bus. In another embodiment, the chip, includes a first memory having a plurality of memory locations, with a predetermined location being for the storage of unalterable secure data; a second memory; means for enabling a data pattern to be stored in the second memory; a memory control logic circuit coupled to the first and second memories for causing data to be stored in the predetermined location of the first memory in response to a write signal whenever the second memory contains a predetermined data pattern; means coupled to the second memory for enabling the contents of the second memory to be erased; a fuse element having an initial state and an irreversibly altered state; and means coupled to the fuse element for irreversibly altering the state of the fuse element in response to a predetermined control signal; wherein the fuse element is coupled to the means for enabling a data pattern to be stored in the second memory so as to enable said data pattern storage only prior to the state of the fuse element being irreversibly altered.

10 Claims, 1 Drawing Sheet

PREVENTION OF ALTERATION OF DATA STORED IN SECURE INTEGRATED CIRCUIT CHIP MEMORY

BACKGROUND OF THE INVENTION

The present invention generally pertains to integrated circuit chips for electronic data processing systems and is particularly directed to preventing alteration of data that is stored within a secure area of an integrated circuit chip.

Integrated circuit chips that store secure data include a secure memory having a plurality of memory locations, with one or more predetermined locations being for the storage of unalterable secure data; and a memory control logic circuit coupled to the secure memory by an address bus for causing data to be stored in locations of the memory indicated by address signals provided on the address bus. The secure memory and the memory control logic circuit are contained within a secure area of the chip.

By delivering appropriate control signals to the memory control logic circuit, it may be possible to cause the memory control logic circuit to enable the secure data stored in the predetermined locations of the secure memory to be replaced by clandestine data that would enable the intended security of the chip to be compromised.

SUMMARY OF THE INVENTION

The present invention provides an integrated circuit chip in which alteration of secure data stored in a predetermined location of a memory on the chip may be prevented. In one aspect of the present invention, the chip includes a memory having a plurality of memory locations, with a predetermined location being for the storage of unalterable secure data; a memory control logic circuit coupled to the memory by an address bus for causing data to be stored in locations of the memory indicated by address signals provided on the address bus; a fuse element having an initial state and an irreversibly altered state; means coupled to the fuse element for irreversibly altering the state of the fuse element in response to a predetermined control signal; and a decoder coupled to the fuse element, the memory control circuit and the address bus for monitoring the state of the fuse element and said address signals, and for preventing the memory control circuit from causing data to be stored in the predetermined memory location after the state of the fuse element has been altered irreversibly whenever the predetermined memory location is indicated by an address signal on the address bus.

Additional security may be provided by shielding the memory, the memory control logic circuit, the decoder, and the fuse element from direct external access and by shielding the memory from inspection.

In another aspect of the present invention, the chip, includes a first memory having a plurality of memory locations, with a predetermined location being for the storage of unalterable secure data; a second memory; means for enabling a data pattern to be stored in the second memory; a memory control logic circuit coupled to the first and second memories for causing data to be stored in the predetermined location of the first memory in response to a write signal whenever the second memory contains a predetermined data pattern; means coupled to the second memory for enabling the contents of the second memory to be erased; a fuse element having an initial state and an irreversibly altered state; and means coupled to the fuse element for irreversibly altering the state of the fuse element in response to a predetermined control signal; wherein the fuse element is coupled to the means for enabling a data pattern to be b stored in the second memory so as to enable said data pattern storage only prior to the state of the fuse element being irreversibly altered.

Additional security may be provided by shielding the memories, the memory control logic circuit, the enabling means, and the fuse element from direct external access, and by shielding the memories from inspection.

Additional features of the present invention are described in relation to the description of the preferred embodiments.

DESCRIPTION OF THE PREFERRED EMBODIMENTS

It is critically important that certain secure data stored in an integrated circuit chip during formation of a product that includes the chip not be modified after the storage of such secure data. To accomplish this purpose the chip includes a system for preventing the alteration of secure data stored in a predetermined memory location. Alternative embodiments of such a prevention system are shown in FIGS. 1 and 2.

Figure 1:
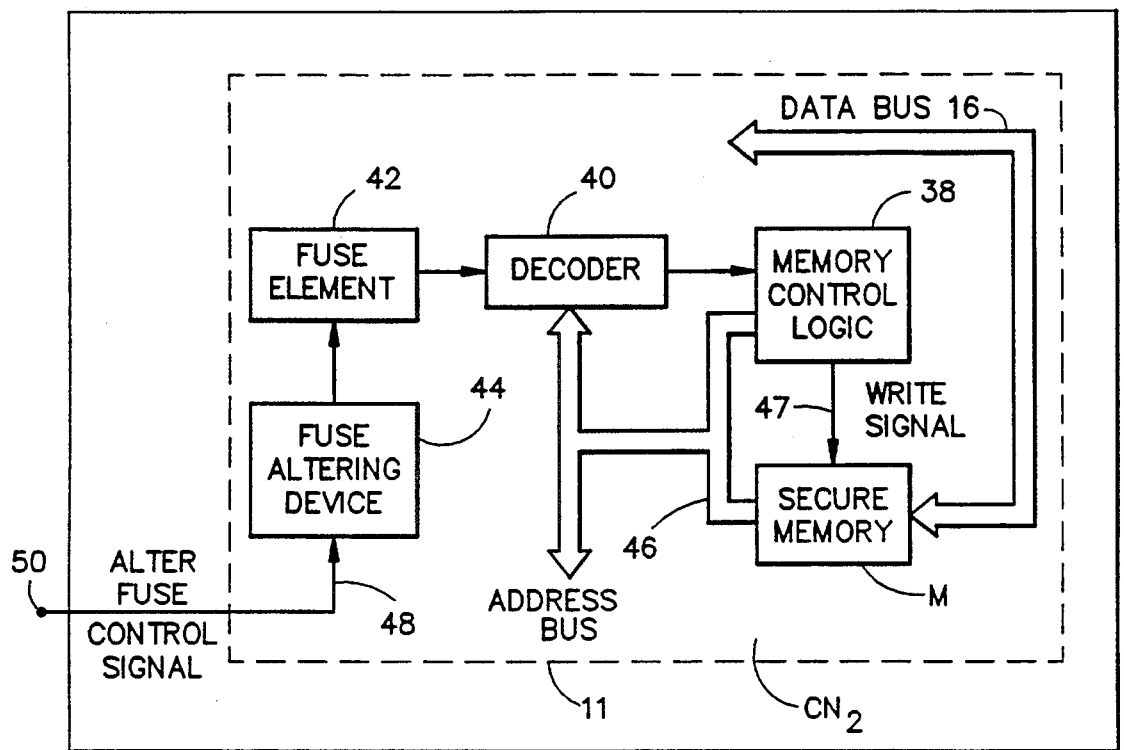
FIG. 1 is a block diagram of one preferred embodiment of a system in the secure area of the chip for preventing the alteration of secure data stored in a predetermined memory location.
Figure 2:
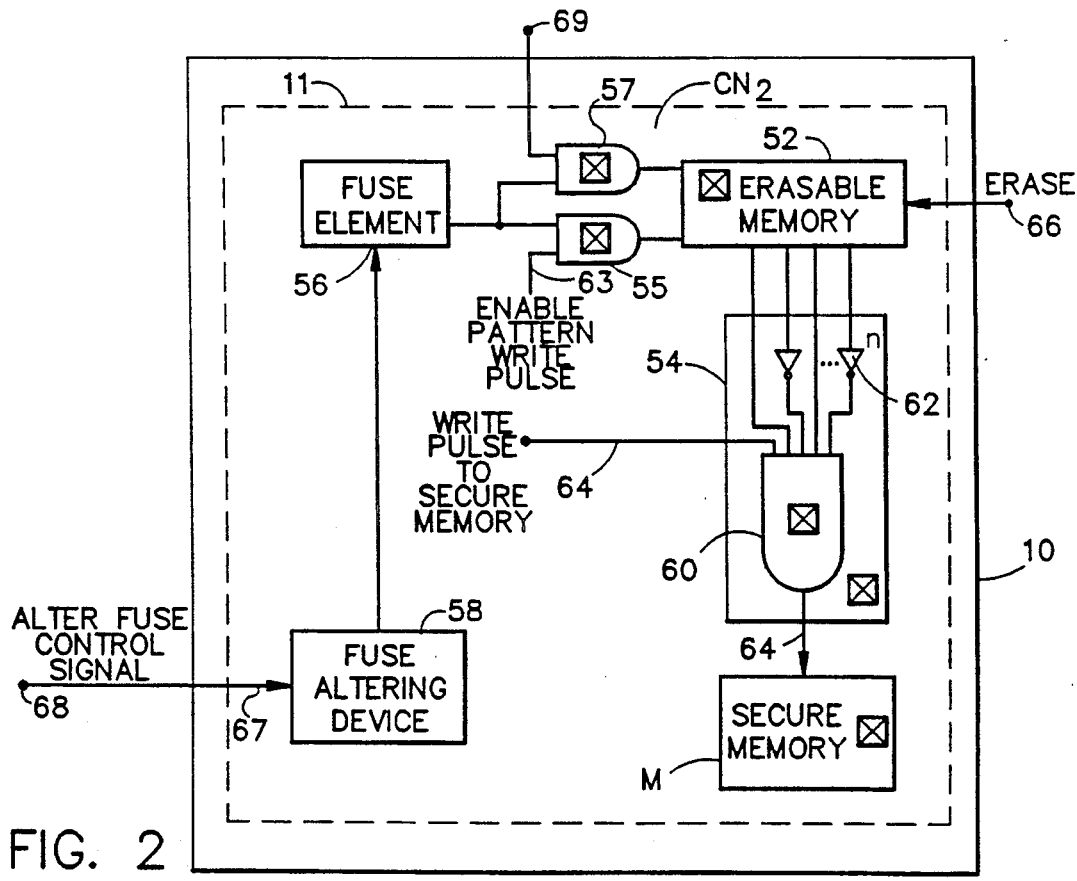
FIG. 2 is a block diagram of an alternative preferred embodiment of a system in the secure area of the chip for preventing the alteration of secure data stored in a predetermined memory location.

The system of FIG. 1 includes a memory M, a memory control logic circuit 38, a decoder 40, a fuse element 42 and a fuse altering device 44 within a secure area 11 of the chip.

The memory M has a plurality of memory locations, with a predetermined location being for the storage of unalterable secure data from a data bus 16.

The memory control logic circuit 38 is coupled to the memory M by an address bus 46 for causing data to be stored in locations of the memory M indicated by address signals provided on the address bus 46 when a "write" signal is provided on line 47 from the memory control logic circuit 38 to the secure memory M.

The fuse element 42 has an initial state and an irreversibly altered state. The term "fuse element" refers to both fuses and antifuses. Fuse elements can be formed in the chip by metallic conductive layers, polysilicon conductive layers or a combination of both. Antifuse elements are formed by P+/N+ semiconductor junction diodes and P−/N− semiconductor junction diodes formed in a semiconductive layer of the chip by conductor/oxide conductor structures or by conductor/amorphous silicon/conductor structures in the chip.

The fuse altering device 44 is coupled to the fuse element 42 for irreversibly altering the state of the fuse element 42 in response to a predetermined control signal received on line 48 from a terminal 50 that is external to the secure area 11. Alternatively, the control signal on line 48 is received from a terminal (not shown) that is internal to the secure area 11.

The decoder 40 is coupled to the fuse element 42, the memory control circuit 38 and the address bus 46 for monitoring the state of the fuse element 42 and the address signals on the address bus 46, and for preventing the memory control circuit 38 from causing data to be stored in the predetermined memory location of the memory M after the state of the fuse element 42 has been altered irreversibly whenever the predetermined memory location is indicated by an address signal on the address bus 46.

A conductive layer $CN_2$ shields the memory M, the memory control logic circuit 38, the decoder 40, and the fuse element 42 from direct external access. The area of the chip covered by the conductive layer $CN_2$ is the secure area 11 of the chip.

The memory M, the memory control logic circuit 38 and the decoder 40 are all coupled to the conductive layer $CN_2$ so as to be powered by a power signal carried by the conductive layer $CN_2$.

The system of FIG. 1 is used to prevent the alteration of secure data initially stored in the predetermined locations of the memory M. Once the state of the fuse element 42 is irreversibly changed, the decoder 40 prevents the writing of any further data into the predetermined memory locations indicated by the address signals on the address bus 46.

Many fuse technologies allow fusing only at a foundry during the secure integrated circuit chip fabrication process. For example, certain foundries may require that an oxide be grown over a polysilicon (or other fuse material) after the fuse has been altered to afford better long term device reliability. The system of FIG. 2 allows a separate manufacturer to store secure data into the secure memory M after foundry fusing, yet still prevents alteration of the contents of the memory M.

The system of FIG. 2 includes a memory M, an erasable memory 52, such as an EPROM or an EEROM (electrically erasable ROM), a memory control logic circuit 54, an enabling circuit 55, a fuse element 56 and a fuse altering device 58 within a secure area 11 of the chip. The memory control logic circuit 54 includes an AND gate 60, and N connections including wiring and inverters 62 that couple the AND gate 60 to the erasable memory 52. The inverters 62 are connected between selected inputs to the AND gate 60 and selected memory locations in the erasable memory 52 so as to define a predetermined data pattern in the erasable memory 52 that must be present to enable the AND gate 60.

The memory M has a plurality of memory locations, with a predetermined location being for the storage of unalterable secure data.

The enabling circuit 55 enables a data pattern to be stored in the erasable memory 52 when a write signal is applied on line 63 to the enabling circuit 55.

The memory control logic circuit 54 couples the memory M to the erasable memory 52 in such a manner as to cause data to be stored in the predetermined location of the first memory M in response to a write signal on line 64 to the AND gate 60 whenever the erasable memory 52 contains a predetermined data pattern.

The contents of the erasable memory 52 may be erased by providing an "erase" control signal at an erase terminal 66 located outside the secure area 11 of the chip.

The fuse element 56 has an initial state and an irreversibly altered state. The fuse altering device 58 is coupled to the fuse element 56 for irreversibly altering the state of the fuse element 56 in response to a predetermined control signal received on line 67 from a terminal 68 that is external to the secure area 11. Alternatively, the control signal on line 67 is received from a terminal (not shown) that is internal to the secure area 11.

A data pattern is provided at a data terminal 69 and fed into the erasable memory through the AND gate 57. The AND gate 57 has one input connected to the fuse element 56 so as to enable data to be written into the erasable memory 52 only while the fuse element 56 is in its initial state.

The fuse element 56 is coupled to the enabling circuit 55 so as to enable the predetermined data pattern to be stored in the erasable memory 52 only prior to the state of the fuse element 56 being irreversibly altered.

N bits of erasable memory 52 are required. At the foundry, the predetermined pattern of ones and zeros corresponding to the pattern of inverters 62 coupling the erasable memory 52 to the AND gate 60 is loaded into the erasable memory 52 to enable the AND gate 60 to pass a "write" control signal on line 64 to the memory M. After the predetermined pattern of ones and zeros is loaded into the erasable memory 52, the state of the fuse element 56 is irreversibly altered so that the predetermined pattern cannot be changed. From this point, processing and packaging of the integrated circuit chip can continue, subject to the condition that the final processing and packaging steps do not disturb the stored predetermined pattern in the erasable memory 52.

After the chip is shipped to a separate manufacturer, secure data can be stored in the secure memory M since the predetermined pattern stored in the erasable memory 52 matches the predetermined pattern hard-wired into the memory control logic circuit 54 by the inverters 62.

Once the secure data is stored in the secure memory M, an "erase" signal is applied to the erase terminal 66 to erase the contents of the erasable memory 52 and thereby prevent alteration of the secure data stored in the secure memory M.

A conductive layer $CN_2$ shields the the memory M, the erasable memory 52, the memory control logic circuit 54, the enabling circuit 55 and the fuse element 56 from direct external access. The area of the chip covered by the conductive layer $CN_2$ is the secure area 11 of the chip.

This technique makes the system of FIG. 2 secure from any attack short of an extremely precise X-ray beam or other complex means that may be used to remotely reprogram the erasable memory 52 through the covering layers of the chip. The security of this technique relies on the fact that it is difficult to remotely reprogram the contents of an EEROM or EPROM, or to reconnect a blown fuse element. If a high power unfocused or diffuse X-ray or other means could essentially randomize the EEROM or EPROM contents, then an attacker could make repeated attempts to achieve the enabling pattern. Thus, security may also require that the EEROM or EPROM cells be designed to be biased in terms of their state, in other words, biased towards a preferred pattern of all ones or all zeros. Thus any unfocused beam would with high probability drive the contents to the preferred pattern, rather than to the predetermined pattern that enables data to be stored in the memory M. Security can also be increased by using a longer predetermined pattern, with a larger number N of bits.

The memory M, the erasable memory 52, the AND gate 60 and the enabling circuit 55 are all coupled to the second conductive layer $CN_2$ so as to be powered by the power signal carried by the second conductive layer $CN_2$.

The technique described herein of covering secure data memory and processing elements of an integrated circuit chip with a conductive layer that both shields such circuit elements from inspection and carries to such circuit elements a predetermined signal that is essential to their operation, such as a power signal, is the subject of a commonly assigned copending patent application, filed on even date herewith, entitled "Secure Integrated Circuit Chip With Conductive Shield".

We claim:

1. An integrated circuit chip in which alteration of secure data stored in a predetermined location of a memory on the chip may be prevented, comprising
    a memory having a plurality of memory locations, with a predetermined location being for the storage of unalterable secure data;
    a memory control logic circuit coupled to the memory and an address bus for causing data to be stored in locations of the memory indicated by address signals provided on the address bus;
    a fuse element having an initial state and an irreversibly altered state;
    means coupled to the fuse element for irreversibly altering the state of the fuse element in response to a predetermined control signal; and
    a decoder coupled to the fuse element, the memory control circuit and the address bus for monitoring the state of the fuse element and said address signals, and for preventing the memory control circuit from causing data to be stored in the predetermined memory location after the state of the fuse element has been altered irreversibly whenever the predetermined memory location is indicated by an address signal on the address bus.

2. A chip according to claim 1, further comprising means for shielding the memory, the memory control logic circuit, the decoder, and the fuse element from direct external access.

3. A chip according to claim 1, further comprising means for shielding the memory from inspection.

4. An integrated circuit chip in which alteration of secure data stored in a predetermined location of a memory on the chip may be prevented, comprising
    a memory for the storage of unalterable secure data;
    a memory control logic circuit coupled to the memory for causing data to be stored in the memory;
    a fuse element having an initial state and an irreversibly altered state;
    means coupled to the fuse element for irreversibly altering the state of the fuse element in response to a predetermined control signal; and
    means coupled to the fuse element and the memory control circuit for monitoring the state of the fuse element and for preventing the memory control circuit from causing data to be stored in the memory after the state of the fuse element has been altered irreversibly.

5. A chip according to claim 4, further comprising means for shielding the memory, the memory control logic circuit, the decoder, and the fuse element from direct external access.

6. A chip according to claim 4, further comprising means for shielding the memory from inspection.

7. An integrated circuit chip in which alteration of secure data stored in a predetermined location of a memory on the chip may be prevented, comprising
    a first memory having a plurality of memory locations, with a predetermined location being for the storage of unalterable secure data;
    a second memory;
    means for enabling a data pattern to be stored in the second memory;
    a memory control logic circuit coupled to the first and second memories for causing data to be stored in the predetermined location of the first memory in response to a write signal whenever the second memory contains a predetermined data pattern;
    means coupled to the second memory for enabling the contents of the second memory to be erased;
    a fuse element having an initial state and an irreversibly altered state; and
    means coupled to the fuse element for irreversibly altering the state of the fuse element in response to a predetermined control signal;
    wherein the fuse element is coupled to the means for enabling a data pattern to be stored in the second memory so as to enable said data pattern storage only prior to the state of the fuse element being irreversibly altered.

8. A chip according to claim 7, further comprising means for shielding the memories, the memory control logic circuit, the enabling means, and the fuse element from direct external access.

9. A chip according to claim 7, further comprising means for shielding the memories from inspection.

10. A chip according to claim 7, further comprising means for shielding the memories and the memory control logic circuit from inspection.

* * * * *